United States Patent
Kikuchi et al.

(10) Patent No.: US 10,910,200 B2
(45) Date of Patent: Feb. 2, 2021

(54) PLASMA PROCESSING APPARATUS AND PRECOATING METHOD

(71) Applicant: TOKYO ELECTRON LIMITED, Tokyo (JP)

(72) Inventors: Yoshiyuki Kikuchi, Tokyo (JP); Akiyoshi Mitsumori, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/714,189

(22) Filed: Dec. 13, 2019

(65) Prior Publication Data

US 2020/0118799 A1 Apr. 16, 2020

Related U.S. Application Data

(62) Division of application No. 15/442,903, filed on Feb. 27, 2017.

(30) Foreign Application Priority Data

Feb. 29, 2016 (JP) .................................. 2016-037831

(51) Int. Cl.
*H01J 37/32* (2006.01)
*C23C 16/44* (2006.01)
(Continued)

(52) U.S. Cl.
CPC .... *H01J 37/32495* (2013.01); *C23C 16/4404* (2013.01); *C23C 16/4405* (2013.01);
(Continued)

(58) Field of Classification Search
CPC ............. C23C 16/4404; C23C 16/4405; C23C 16/455; C23C 16/50
See application file for complete search history.

(56) References Cited

U.S. PATENT DOCUMENTS 7,727,906 B1* 6/2010 Shanker ................ C23C 16/045 438/778
2005/0042869 A1* 2/2005 Ohmi ................ H01L 21/02247 438/689

FOREIGN PATENT DOCUMENTS

JP H11-067737 A 3/1999
JP 2003-183839 A 7/2003
(Continued)

OTHER PUBLICATIONS

Decision to Grant a Patent issued for Japanese Patent Application No. 2016-037831 dated Nov. 6, 2019, 7 pages.

*Primary Examiner* — Kelly M Gambetta
(74) *Attorney, Agent, or Firm* — Rothwell, Figg, Ernst & Manbeck, P.C.

(57) ABSTRACT

A plasma processing apparatus includes a partition plate, an antenna, and a high frequency power supply. The partition plate has a plurality of holes and partitions an inside of the processing container into a plasma generation chamber and a processing chamber. The antenna generates plasma of the plasma excitation gas supplied into the plasma generation chamber. The high frequency power supply generates plasma of a precoating gas supplied into the plasma generation chamber and introduced into the processing chamber through the plurality of holes of the partition plate. The plasma processing apparatus performs a precoating on a surface of a partition plate on a side of the processing chamber by causing the high frequency power supply to generate plasma of the precoating gas before a plasma processing using the plasma of the plasma excitation gas is performed.

6 Claims, 5 Drawing Sheets

(51) Int. Cl.
*C23C 16/455* (2006.01)
*C23C 16/50* (2006.01)

(52) U.S. Cl.
CPC ............ *C23C 16/455* (2013.01); *C23C 16/50* (2013.01); *H01J 37/3222* (2013.01); *H01J 37/3244* (2013.01); *H01J 37/32082* (2013.01); *H01J 37/32357* (2013.01)

(56) References Cited

FOREIGN PATENT DOCUMENTS

| | | |
|---|---|---|
| JP | 2005-150622 A | 6/2005 |
| JP | 2007-157696 A | 6/2007 |
| JP | 2008-159928 A | 7/2008 |
| JP | 2010-013676 A | 1/2010 |
| JP | 2010-512031 A | 4/2010 |
| JP | 2011-230980 A | 11/2011 |
| JP | 2013-084552 A | 5/2013 |
| JP | 2015-173182 A | 10/2015 |

* cited by examiner

PLASMA PROCESSING APPARATUS AND PRECOATING METHOD

CROSS-REFERENCE TO RELATED APPLICATIONS

This application is a Divisional of U.S. patent application Ser. No. 15/442,903, filed on Feb. 27, 2017, which claims priority from Japanese Patent Application No. 2016-037831, filed on Feb. 29, 2016, with the Japan Patent Office, the disclosures of which are incorporated herein in their entireties by reference.

TECHNICAL FIELD

Various aspects and exemplary embodiments of the present disclosure relate to a plasma processing apparatus and a precoating method.

BACKGROUND

Conventionally, there has been a plasma processing apparatus in which a partition plate having a plurality of holes is provided in a processing container such that the inside of the processing container is partitioned into a plasma generation chamber and a processing chamber by the partition plate. Hereinafter, the plasma processing apparatus in which the inside of the processing container is partitioned into the plasma generation chamber and the processing chamber by the partition plate will be referred to as a "separation type plasma processing apparatus." In the separation type plasma processing apparatus, plasma of a plasma excitation gas is generated in the plasma generation chamber, and active species in the generated plasma are supplied into the processing chamber through the plurality of holes of the partition plate. When the active species supplied into the processing chamber through the plurality of holes of the partition plate are irradiated to a processing gas in the processing chamber, the processing gas is excited, and active species newly generated from the processing gas fall onto a workpiece placed on a placing table inside the processing chamber. In this way, a desired processing such as a film formation or an etching is performed on a workpiece. See, for example, Japanese Laid-Open Patent Publication No. 2003-183839.

SUMMARY

In an aspect, a plasma processing apparatus of the present disclosure includes: a processing container; a partition plate that has a plurality of holes each having a maximum width that is two times or less a sheath length corresponding to plasma of a plasma excitation gas, and partitions an inside of the processing container into a plasma generation chamber and a processing chamber; a first gas supply unit that supplies the plasma excitation gas into the plasma generation chamber; a second gas supply unit that supplies a precoating gas into at least one of the plasma generation chamber and the processing chamber; a first plasma source that generates plasma of the plasma excitation gas supplied into the plasma generation chamber by the first gas supply unit; a second plasma source that generates plasma of the precoating gas supplied into the plasma generation chamber by the second gas supply unit and introduced into the processing chamber through the plurality of holes of the partition plate, or plasma of the precoating gas supplied into the processing chamber by the second gas supply unit; and a controller that causes the second plasma source to generate the plasma of the precoating gas before a plasma processing using the plasma of the plasma excitation gas is performed such that a precoating is performed on a surface of a partition plate on a side of the processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
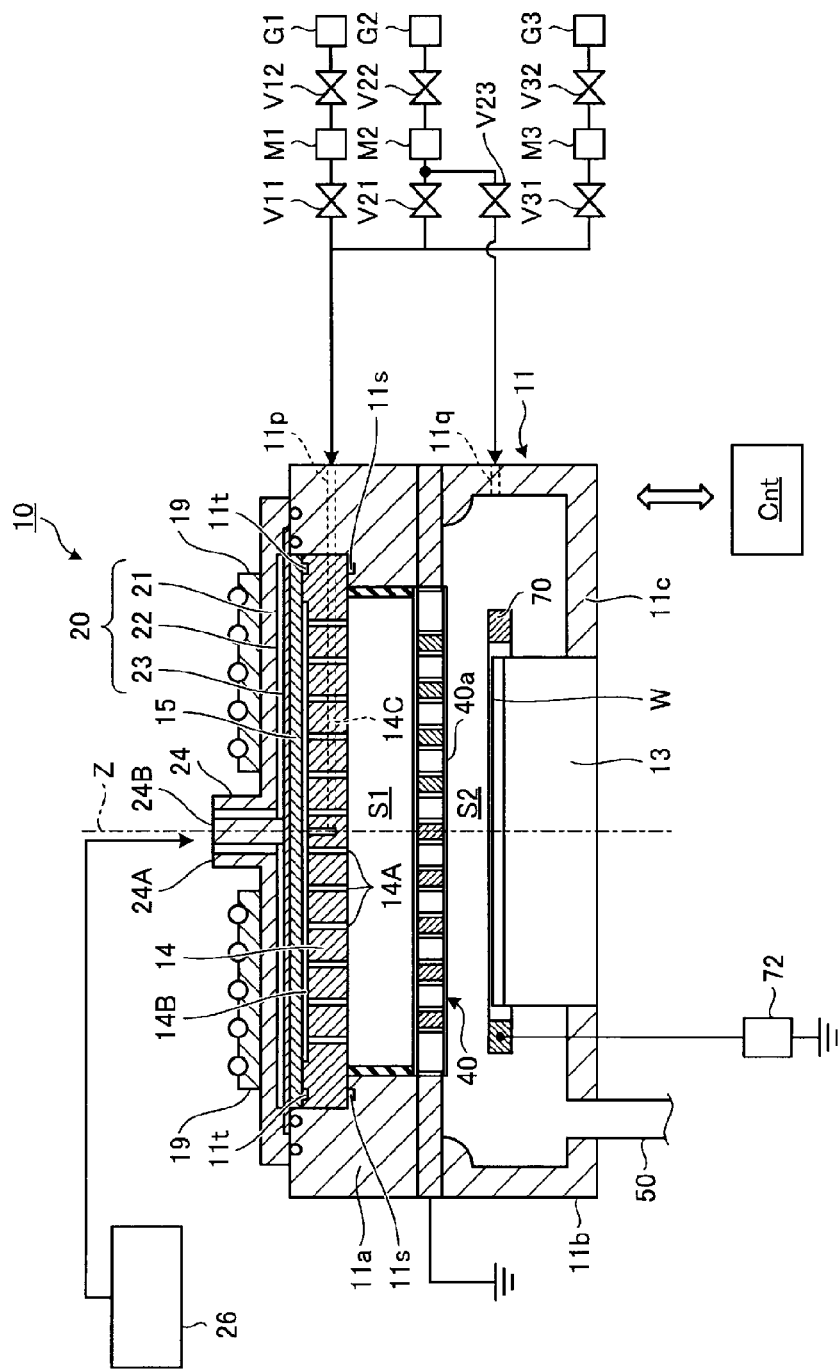
FIG. 1 is a view illustrating an exemplary configuration of a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the separation type plasma processing apparatus, since the inner wall of the plasma generation chamber is exposed to plasma, the inner wall of the plasma generation chamber may be scraped, and the material of the inner wall may scatter as particles inside the plasma generation chamber. When the particles scatter inside the plasma generation chamber, the scattered particles may enter the processing chamber through the plurality of holes of the partition plate and adhere to the workpiece inside the processing chamber thereby contaminating the workpiece.

Meanwhile, in order to improve a plasma resistance of the plasma generation chamber, it may be taken into account to perform a precoating for the plasma generation chamber to form a protective film. In this case, the precoating is performed for the plasma generation chamber by providing a plasma source in the plasma generation chamber and generating plasma of a precoating gas supplied into the plasma generation chamber.

However, it is difficult to form the protective film on the surface of the partition plate on the side of the processing chamber merely by performing the precoating for the plasma generation chamber because the plasma of the precoating gas is difficult to reach the surface of the partition plate on the side of the processing chamber. Especially, in the latest separation type plasma processing apparatus, in order to suppress the plasma generated in the plasma generation chamber from excessively leaking into the processing chamber, a maximum width of each of the plurality of holes of the partition plate may be set to be two times or less a sheath length corresponding to the plasma. In this case, even when plasma of the precoating gas is generated in the plasma generation chamber, the plasma of the precoating gas generated in the plasma generation chamber is difficult to pass through the plurality of holes of the partition plate. Therefore, the protective film may not be formed on the surface of the partition plate on the side of the processing chamber. When the protective film is not formed, the surface of the partition plate on the side of the processing chamber is exposed to the active species generated from the processing gas in the processing chamber. As a result, the surface of the partition plate on the side of the processing chamber is scraped, and thus, the partition plate is worn away. Then, the material of the partition plate may scatter as particles inside the processing chamber due to the wearing away of the partition plate. When the particles scatter inside the processing chamber, the scattering particles may adhere to the workpiece inside the processing chamber thereby contaminating the workpiece.

In an aspect, a plasma processing apparatus of the present disclosure includes: a processing container; a partition plate that has a plurality of holes each having a maximum width that is two times or less a sheath length corresponding to plasma of a plasma excitation gas, and partitions an inside of the processing container into a plasma generation chamber and a processing chamber; a first gas supply unit that supplies the plasma excitation gas into the plasma generation chamber; a second gas supply unit that supplies a precoating gas into at least one of the plasma generation chamber and the processing chamber; a first plasma source that generates plasma of the plasma excitation gas supplied into the plasma generation chamber by the first gas supply unit; a second plasma source that generates plasma of the precoating gas supplied into the plasma generation chamber by the second gas supply unit and introduced into the processing chamber through the plurality of holes of the partition plate, or plasma of the precoating gas supplied into the processing chamber by the second gas supply unit; and a controller that causes the second plasma source to generate the plasma of the precoating gas before a plasma processing using the plasma of the plasma excitation gas is performed such that a precoating is performed on a surface of a partition plate on a side of the processing chamber.

In the above-described plasma processing apparauts, the first plasma source generates the plasma of the plasma excitation gas in the plasma generation chamber by emitting microwaves into the plasma generation chamber, and the second plasma source generates the plasma of the precoating gas in the processing chamber by supplying a high frequency power to an electrode provided in the processing chamber or a placing table inside the processing container.

In the above-described plasma processing apparatus, the first plasma source generates the plasma of the plasma excitation gas in the plasma generation chamber by forming an induction field in the plasma generation chamber when a high frequency power is supplied, the second plasma source generates the plasma of the precoating gas in the processing chamber by supplying a high frequency power to an electrode provided in the processing chamber or a placing table inside the processing container, and the plasma processing apparatus further includes a switch that selectively supplies a high frequency power from the second plasma source to any one of the electrode provided in the processing chamber or the placing table inside the processing container, and the first plasma source.

A precoating method of the present disclosure uses a plasma processing apparatus including: a processing container; a partition plate that has a plurality of holes each having a maximum width that is two times or less a sheath length corresponding to plasma of a plasma excitation gas, and partitions an inside of the processing container into a plasma generation chamber and a processing chamber; a first gas supply unit that supplies the plasma excitation gas into the plasma generation chamber; a second gas supply unit that supplies a precoating gas into at least one of the plasma generation chamber and the processing chamber; a first plasma source that generates plasma of the plasma excitation gas supplied into the plasma generation chamber by the first gas supply unit; and a second plasma source that generates plasma of the precoating gas supplied into the processing chamber by the second gas supply unit or plasma of the precoating gas supplied into the plasma generation chamber by the second gas supply unit and introduced into the processing chamber through the plurality of holes of the partition plate. A precoating is performed on a surface of the partition plate on a side of the processing chamber by causing the second plasma source to generate the plasma of the precoating gas before a plasma processing using the plasma of the plasma excitation gas is performed.

According to one aspect of the plasma processing apparatus as described above, it is possible to achieve an effect on suppressing the contamination of the workpiece caused by the wearing away of the partition plate.

Hereinafter, an exemplary embodiment of the plasma processing apparatus will be described in detail based on the drawings. The present disclosure is not limited to the exemplary embodiment.

FIG. 1 is a view illustrating an exemplary configuration of a plasma processing apparatus according to an exemplary embodiment. As illustrated in FIG. 1, a plasma processing apparatus 10 includes a processing container 11. The processing container 11 has a substantially cylindrical shape extending along a direction in which an axis Z extends (hereinafter, referred to as the "axis-Z direction") and defines a space therein. This space is partitioned into a plasma generation chamber S1 and a processing chamber S2 provided below the plasma generation chamber S1, along the axis-Z direction by a partition plate 40 to be described later.

The processing container 11 may include a first side wall 11a, a second side wall 11b, and a bottom portion 11c. The first side wall 11a has a substantially cylindrical shape extending in the axis-Z direction and defines the plasma generation chamber S1.

Below the first side wall 11a, the second side wall 11b extends to be continuous to the first side wall 11a. The second side wall 11b has a substantially cylindrical shape extending in the axis-Z direction and defines the processing chamber S2. A placing table 13 is provided inside the processing chamber S2 to place a substrate W as a workpiece thereon. In the present exemplary embodiment, the placing table 13 is provided with a temperature control mechanism such as, for example, a heater or a cooler, and an attractive holding mechanism such as, for example, an electrostatic chuck.

An opening is provided at the top end of the first side wall 11a, and a shower plate 14 is attached within the opening via a seal ring 11s in order to seal the plasma generation chamber S1. The shower plate 14 is formed of a dielectric material such as, for example, $Al_2O_3$ or $SiO_2$. A plurality of openings 14A are formed on the shower plate 14 to inject various gases into the plasma generation chamber S1. Further, a cover plate 15 is attached to the upper side of the shower plate 14 via a seal ring 11t. The cover plate 15 is formed of a dielectric material such as, for example, $Al_2O_3$ or $SiO_2$.

A gas passage 14B is formed on the top surface of the shower plate 14, and each of the plurality of openings 14A is formed to communicate with the gas passage 14B. Further, a gas supply passage 14C is formed inside the shower plate 14. The gas passage 14B is connected to the gas supply passage 14C.

In addition, a gas line 11p is formed in the first side wall 11a. The gas line 11p extends from the outer surface of the first side wall 11a to be connected to the gas supply passage 14C of the shower plate 14.

In addition, a gas source G1 is connected to the gas line 11p via a valve V11, a mass flow controller M1, and a valve V12. The gas source G1 supplies a plasma excitation gas or a cleaning gas. In the present exemplary embodiment, the plasma excitation gas is, for example, a rare gas (e.g., Ar gas) or $H_2$ gas. The gas source G1, the valve V11, the mass flow controller M1, the valve V12, the gas line 11p, the shower plate 14, the gas supply passage 14C, the gas passage 14B, and the plurality of openings 14A constitute a "plasma excitation gas supply system." The plasma excitation gas supply system controls a flow rate of the plasma excitation gas supplied from the gas source G1 by using the mass flow controller M1, and supplies the flow rate controlled plasma excitation gas into the plasma generation chamber S1. The plasma excitation gas supply system is an example of a first gas supply unit.

In addition, a gas source G2 is connected to the gas line 11p via a valve V21, a mass flow controller M2, and a valve V22. The gas source G2 is a gas source of a processing gas used for a processing of the substrate W such as, for example, a film formation or an etching. As a processing gas for performing a film formation, for example, a precursor gas (e.g., dimethoxytetramethyldisiloxane (DMOTMDS)) is used. The gas source G2, the valve V22, the mass flow controller M2, the valve V21, the gas line 11p, the shower plate 14, the gas supply passage 14C, the gas passage 14B, and the plurality of openings 14A constitute a "first processing gas supply system." The first processing gas supply system controls a flow rate of the processing gas supplied from the gas source G2 by using the mass flow controller M2, and supplies the flow rate controlled processing gas into the plasma generation chamber S1.

In addition, a gas source G3 is connected to the gas line 11p via a valve V31, a mass flow controller M3, and a valve V32. The gas source G3 supplies a precoating gas. In the present exemplary embodiment, the precoating gas is, for example, a precursor gas (e.g., dimethoxytetramethyldisiloxane (DMOTMDS)). The gas source G3, the valve V32, the mass flow controller M3, the valve V31, the gas line 11p, the shower plate 14, the gas supply passage 14C, the gas passage 14B, and the plurality of openings 14A constitute a "precoating gas supply system." The precoating gas supply system controls a flow rate of the precoating gas supplied from the gas source G3 by using the mass flow controller M3, and supplies the flow rate controlled precoating gas into the plasma generation chamber S1. The precoating gas supply system is an example of a second gas supply unit. In addition, when the precoating gas and the processing gas for performing the film formation are identical to each other, the precoating gas supply system may be omitted, and the processing gas supply system may perform the function of the precoating gas supply system. In this case, the processing gas supply system corresponds to the second gas supply unit.

Further, a gas line 11q is formed in the first side wall 11a. The gas line 11q extends from the outer surface of the first side wall 11a to communicate with the processing chamber S2. The gas source G2 is connected to the gas line 11q via the valve V23, the mass flow controller M2, and the valve V22. The gas source G2, the valve V22, the mass flow controller M2, the valve V23, and the gas line 11p constitute a "second processing gas supply system." The second processing gas supply system controls a flow rate of the processing gas supplied from the gas source G2 by using the mass flow controller M2, and supplies the flow rate controlled processing gas into the processing chamber S2.

In addition, an antenna 20 is provided on the top end of the first side wall 11a to be in contact with the cover plate 15. A cooling jacket 19 is provided on the antenna 20 to cool the antenna 20.

The antenna 20 generates plasma of the plasma excitation gas supplied from the plasma excitation gas supply system in the plasma generation chamber S1, by emitting microwaves into the plasma generation chamber S1. The antenna 20 is an example of a first plasma source. In the present exemplary embodiment, the antenna 20 is, for example, a radial line slot antenna. The antenna 20 includes an antenna body 21, a dielectric plate 22, and a slot plate 23.

The antenna body 21 is formed by a conductive member such as, for example, a metal and has a disc shape. The antenna body 21 is connected to an external conductor 24A of a coaxial waveguide 24 to be described later.

The dielectric plate 22 shortens the wavelength of the microwaves and has a substantially disc shape. The dielectric plate 22 is formed of, for example, quartz or alumina. The dielectric plate 22 is provided between the slot plate 23 and the metal-made bottom surface of the antenna body 21.

The slot plate 23 is a substantially disc shaped metal plate which is formed with a plurality of slot pairs emitting the microwaves.

The plasma processing apparatus 10 further includes the coaxial waveguide 24 and a microwave generator 26. The microwave generator 26 generates microwaves having a frequency of, for example, 2.45 GHz. The microwave generator 26 is connected to the top portion of the coaxial waveguide 24 via, for example, a tuner, a waveguide, and a mode converter. The coaxial waveguide 24 extends along the axis Z as a central axis thereof. The coaxial waveguide 24 includes the external conductor 28A and an internal conductor 28B. The external conductor 24A has a cylindrical shape extending on the basis of the axis Z as the central axis thereof. The bottom end of the external conductor 24A is electrically connected to the top portion of the antenna body 21 as a conductive surface. The internal conductor 24B has a substantially cylindrical shape extending along the axis Z and is provided inside the external conductor 24A. The bottom end of the internal conductor 24B is connected to the slot plate 23 of the antenna 20.

The microwaves generated by the microwave generator 26 are propagated to the dielectric plate 22 through the coaxial waveguide 24. The microwaves propagated to the dielectric plate 22 are propagated to the cover plate 15 and the shower plate 14 through slot holes of the slot plate 23. The cover plate 15 and the shower plate 14 emit the microwaves propagated from the antenna 20 into the plasma generation chamber S1. Accordingly, an electric field is generated directly below the shower plate 14 by the microwaves so that the plasma is generated in the plasma generation chamber S1.

In the plasma processing apparatus 10 of the present exemplary embodiment, a partition plate 40 is provided between the plasma generation chamber S1 and the processing chamber S2, and the plasma generation chamber S1 and the processing chamber S2 are separated from each other by the partition plate 40.

Figure 2:
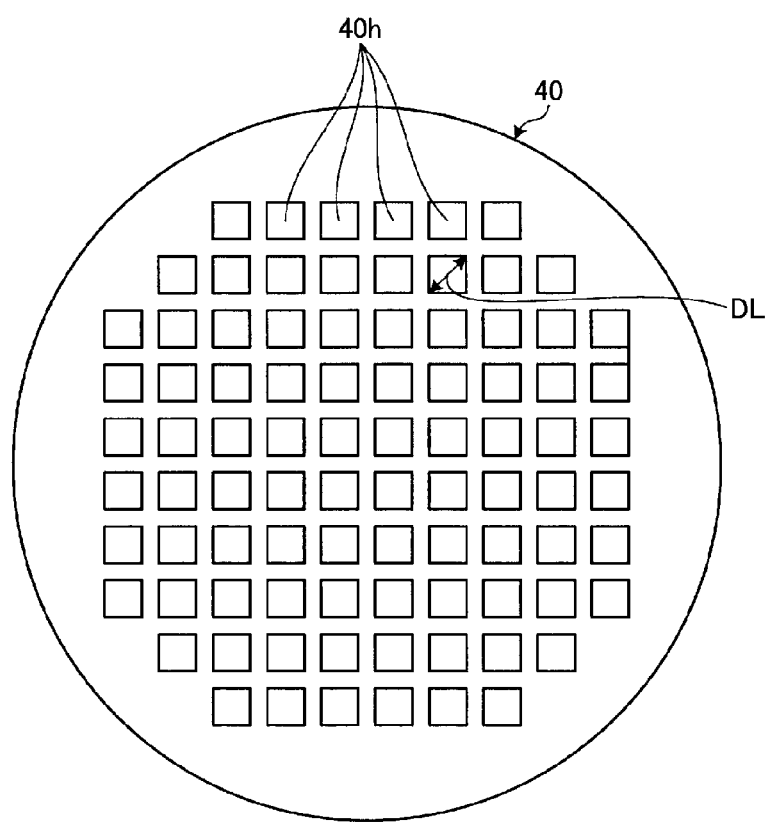
FIG. 2 is a plan view illustrating an exemplary partition plate in the exemplary embodiment.

The partition plate 40 is formed of, for example, a metal (e.g., aluminum) or a semiconductor (e.g., silicon). The partition plate 40 is a substantially disc shaped member as illustrated in FIG. 2. FIG. 2 is a plan view illustrating an exemplary partition plate in an exemplary embodiment. The partition plate 40 has a plurality of holes 40h to cause the plasma generation chamber S1 and the processing chamber S2 to communicate with each other. In the present exemplary embodiment, in order to suppress the plasma generated in the plasma generation chamber S1 from excessively leaking into the side of the processing chamber S2, a maximum width of each of the plurality of holes 40h is set to a value equal to or less than two times a sheath length corresponding to the plasma of the plasma excitation gas. In the example of FIG. 2, each of the plurality of holes 40h is formed in a rectangular shape, and the diagonal length DL of each of the plurality of holes 40h is set to a value equal to or less than two times the sheath length corresponding to the plasma of the plasma excitation gas.

Referring back to FIG. 1, in order to improve the plasma resistance of the partition plate 40, the surface of the partition plate 40 is covered with an insulating member 40a made of an insulating material (e.g., yttria oxide or yttrium fluoride).

A bias power supply (not illustrated) is connected to the partition plate 40 to apply a bias voltage to the insulating member 40a of the partition plate 40. The bias power supply is a high frequency power supply that generates a high frequency bias power. Alternatively, the bias power supply may be a DC power supply. When a power is applied to the insulating member 40a of the partition plate 40 by the bias power supply, active species such as, for example, charged particles in the plasma generated in the plasma generation chamber S1 are accelerated toward the partition plate 40. As a result, the velocity of the active species passing through the partition plate 40 increases.

An exhaust pipe 50 is connected to the bottom portion 11c of the processing container 11. A pressure regulator and a decompression pump (not illustrated) are connected to the exhaust pipe 50. The pressure regulator and the decompression pump constitute an exhaust device. In the plasma processing apparatus 10, the flow rate of the plasma excitation gas may be regulated by the mass flow controller M1, the flow rate of the processing gas may be regulated by the mass flow controller M2, and an exhaust rate from the processing chamber S2 may be regulated by the pressure regulator. Accordingly, the plasma processing apparatus 10 may set the pressure of the plasma generation chamber S1 and the processing chamber S2 to an arbitrary pressure.

The plasma processing apparatus 10 of the present embodiment further includes an electrode 70 and a high frequency power supply 72. The electrode 70 is provided inside the processing chamber S2. The electrode 70 is annularly arranged to surround the periphery of the placing table 13 in the processing chamber S2.

The high frequency power supply 72 is electrically connected to the electrode 70. The high frequency power supply 72 supplies a predetermined high frequency power to the electrode 70 so as to supply electromagnetic wave energy to a precoating gas supplied from the precoating gas supply system into the processing chamber S2 and introduced into the processing chamber S2 through the plurality of holes 40h of the partition plate 40. As a result, the high frequency power supply 72 generates plasma of the precoating gas in the processing chamber S2. The high frequency power supply 72 is an example of a second plasma source.

As illustrated in FIG. 1, the plasma processing apparatus 10 further includes a controller Cnt. The controller Cnt is, for example, a computer device having a storage device storing a program. The controller Cnt reads a program based on a recipe stored in the storage device and controls the respective units of the plasma processing apparatus 10 according to the read program. For example, the controller Cnt may control the supply of the plasma excitation gas from the gas source G1 and stop of the supply by sending control signals to the valves V11 and V12, and control the flow rate of the plasma excitation gas by sending a control signal to the mass flow controller M1. Further, the controller Cnt may control the supply of the processing gas from the gas source G2 and stop of the supply by sending control signals to the valves V21 and V22, and control the flow rate of the processing gas by sending a control signal to the mass flow controller M2. Further, the controller Cnt may control the supply of the precoating gas from the gas source G3 and stop of the supply by sending control signals to the valves V31 and V32, and control the flow rate of the processing gas by sending a control signal to the mass flow controller M3. Further, the controller Cnt may control the exhaust rate by sending a control signal to the pressure regulator. Further, the controller Cnt may control the power of the microwaves by sending a control signal to the microwaves generator 26. Further, the controller Cnt may control the power of the high frequency power (RF power) by sending a control signal to the high frequency power supply 72. Further, the controller Cnt may control the supply of the bias power to the partition plate 40, stop of the supply, and the bias power by sending a control signal to the bias power supply. Further, the controller Cnt may control the temperature of the placing table 13 by sending a control signal to the temperature control mechanism of the placing table 13.

For example, before a plasma processing using the plasma of the plasma excitation gas is performed, the controller Cnt causes the high frequency power supply 72 to generate the plasma of the precoating gas such that a precoating is performed on the surface of the partition plate 40 on the side of the processing chamber S2. Here, the precoating is a processing for forming a protective film having the plasma resistance.

Figure 3:
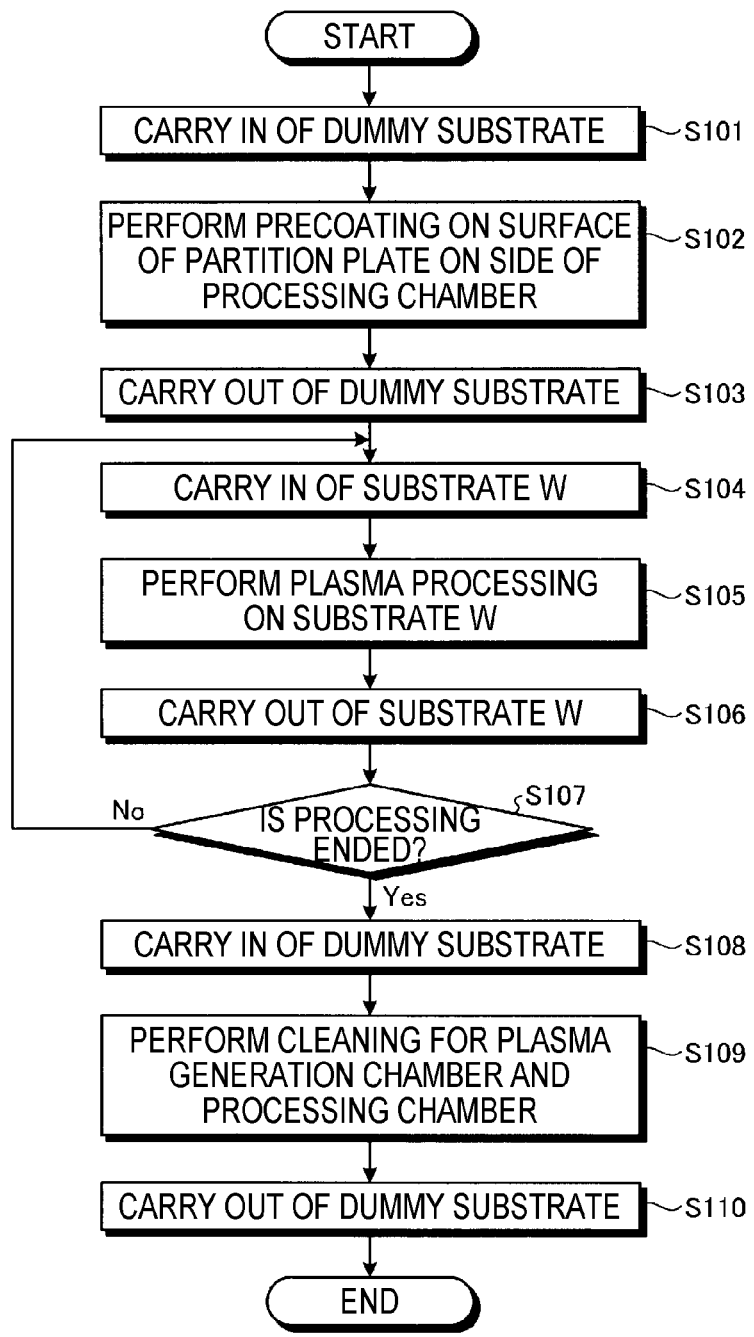
FIG. 3 is a flow chart illustrating an exemplary processing flow of a precoating method using the plasma processing apparatus according to the exemplary embodiment.

Next, descriptions will be made on an exemplary processing flow of a precoating method using the plasma processing apparatus 10 according to an exemplary embodiment. FIG. 3 is a flow chart illustrating an exemplary processing flow of a precoating method using the plasma processing apparatus according to an exemplary embodiment.

As illustrated in FIG. 3, first, a substrate (hereinafter, referred to as a "dummy substrate") other than the substrate W is carried into the processing container 11 (step S101) and placed on the placing table 13. Subsequently, the plasma processing apparatus 10 performs a precoating for the plasma generation chamber S1. That is, the controller Cnt of the plasma processing apparatus 10 supplies the plasma excitation gas and the precoating gas into the plasma generation chamber S1 in the state where the dummy substrate is placed on the placing table 13. Then, the controller Cnt causes the antenna 20 to emit microwaves so as to generate plasma of the plasma excitation gas and the precoating gas in the plasma generation chamber S1. Accordingly, the plasma processing apparatus 10 performs the precoating for the plasma generation chamber S1. When the precoating for the plasma generation chamber S1 is performed, a protective film is formed on a portion of the wall surface of the processing container 11 which corresponds to the plasma generation chamber S1. Further, a protective film is formed on the surface of the partition plate 40 on the side of the plasma generation chamber S1.

Subsequently, the plasma processing apparatus 10 performs a precoating on the surface of the partition plate 40 on the side of the processing chamber S2 (step S102). That is, the controller Cnt of the plasma processing apparatus 10 supplies the precoating gas into the plasma generation chamber S1 in the state where the dummy substrate is placed on the placing table 13. Then, the controller Cnt causes the high frequency power supply 72 to supply a high frequency power to the electrode 70 so as to generate plasma of the precoating gas supplied into the plasma generation chamber S1 and introduced into the processing chamber S2 through the plurality of holes 40$h$ of the partition plate 40. Accordingly, the controller Cnt performs the precoating on the surface of the partition plate 40 on the side of the processing chamber S2. When the precoating is performed on the surface of the partition plate 40 on the side of the processing chamber S2, a protective film is formed on the surface of the partition plate 40 on the side of the processing chamber S2. Further, a protective film is formed on a portion of the wall surface of the processing container 11 which corresponds to the processing chamber S1.

Thereafter, the dummy substrate is separated from the placing table 13 and carried out of the processing container 11 (step S103). Subsequently, the substrate W is carried into the processing container 11 and placed on the placing table 13 (step S104).

Subsequently, the plasma processing apparatus 10 performs a plasma processing on the substrate W (step S105). As the plasma processing, for example, an etching or a film formation is taken into account. When an etching is performed on the substrate W, the controller Cnt of the plasma processing apparatus 10 performs the etching according to the following procedures. That is, after the precoating is performed on the surface of the partition plate 40 on the side of the processing chamber S2, the controller Cnt causes the plasma excitation gas supply system to supply the plasma excitation gas into the plasma generation chamber S1, in the state where the substrate W is placed on the placing table 13. In addition, the controller Cnt causes the first processing gas supply system to supply a processing gas (an etching gas) into the plasma generation chamber S1. Then, the controller Cnt causes the antenna 20 to emit microwaves so as to generate plasma of the plasma excitation gas and plasma of the processing gas in the plasma generation chamber S1. The active species in the plasma generated in the plasma generation chamber S1 are guided to the plurality of holes 40$h$ of the partition plate 40. Then, the substrate W in the processing chamber S2 is etched by the active species supplied into the processing chamber S2 through the plurality of holes 40$h$ of the partition plate 40.

In addition, when a film formation is performed on the substrate W, the controller Cnt of the plasma processing apparatus 10 performs the film formation according to the following procedures. That is, after the precoating is performed on the surface of the partition plate 40 on the side of the processing chamber S2, the controller Cnt causes the plasma excitation gas supply system to supply the plasma excitation gas into the plasma generation chamber S1 in the state where the substrate W is placed on the placing table 13. In addition, the controller Cnt causes the second processing gas supply system to supply a processing gas (a film formation gas) into the processing chamber S2. Then, the controller Cnt causes the antenna 20 to emit microwaves so as to generate plasma of the plasma excitation gas in the plasma generation chamber S1. The active species in the plasma generated in the plasma generation chamber S1 are guided to the plurality of holes 40$h$ of the partition plate 40. The active species supplied into the processing chamber S2 through the plurality of holes 40$h$ of the partition plate 40 react with the processing gas supplied into the processing chamber S2. Then, the film formation is performed on the substrate W inside the processing chamber S2 by a reaction product obtained from the reaction between the active species and the processing gas.

Thereafter, the substrate W is separated from the mounting table 13 and carried out of the processing container 11 (step S106). Then, when the processing is continued (step S107; No), the plasma processing apparatus 10 returns the processing to step S104.

Meanwhile, when the processing is ended (step S108; Yes), the dummy substrate is carried into the processing chamber 11 (step S108) and placed on the placing table 13. Subsequently, the plasma processing apparatus 10 performs a cleaning processing for the plasma generation chamber S1 and the processing chamber S2 (step S109). That is, the controller Cnt of the plasma processing apparatus 10 supplies a cleaning gas into the plasma generation chamber S1 and the processing chamber S2 in the state where the dummy substrate is placed on the placing table 13. Then, the controller Cnt causes the antenna 20 to emit microwaves so as to generate plasma of the cleaning gas in the plasma generation chamber S1. In addition, the controller Cnt causes the high frequency power supply 72 to supply a high frequency power to the electrode 70 so as to generate plasma of the cleaning gas supplied into the plasma generation chamber S1 and introduced into the processing chamber S2 through the plurality of holes 40$h$ of the partition plate 40. Accordingly, the plasma processing apparatus 10 performs the cleaning processing for the plasma generation chamber S1 and the processing chamber S2.

Thereafter, the dummy substrate is separated from the mounting table 13 and carried out of the processing container 11 (step S110), and the processing is ended.

As described above, according to the present exemplary embodiment, the plasma processing apparatus 10 includes the partition plate 40 that has the plurality of holes 40$h$ each of which a maximum width is two times or less a sheath length corresponding to plasma of the plasma excitation gas, and partitions the inside of the processing container 11 into the plasma generation chamber S1 and the processing chamber S2. In addition, the plasma processing apparatus 10 includes the antenna 20 that generates plasma of the plasma excitation gas supplied into the plasma generation chamber S1 by the plasma excitation gas supply system. In addition, the plasma processing apparatus 10 includes the high frequency power supply 72 that generates plasma of the precoating gas supplied into the plasma generation chamber S1 by the precoating gas supply system and introduced into the processing chamber S2 through the plurality of holes 40$h$ of the partition plate 40. In addition, before a plasma processing using the plasma of the plasma excitation gas is performed, the plasma processing apparatus 10 performs the precoating on the surface of the partition plate 40 on the side of the processing chamber S2 by causing the high frequency power supply 72 to generate plasma of the precoating gas.

With the configuration of the plasma processing apparatus 10, even in a situation where the plasma generated in the plasma generation chamber S1 is difficult to reach the surface of the partition plate 40 on the side of the processing chamber S2, the plasma of the precoating gas may be stably generated in the processing chamber S2. Accordingly, a protective film is stably formed on the surface of the partition plate 40 on the side of the processing chamber S2. Thus, a situation where the surface of the partition plate 40 on the side of the processing chamber S2 is directly exposed to the active species generated from the processing gas may be avoided, so that the generation of particles from the surface of the partition plate 40 on the side of the processing chamber S2 may be suppressed. As a result, when a plasma processing is performed on the substrate W as a workpiece, the contamination of the substrate W caused from the wearing away of the partition plate 40 may be suppressed.

In the above-described exemplary embodiment, the example where the precoating gas supply system supplies the precoating gas into the plasma generation chamber S1 has been described. However, the present disclosure is not limited thereto. For example, the precoating gas supply system may supply the precoating gas into the processing chamber S2. In addition, the precoating gas supply system may supply the precoating gas into the plasma generation chamber S1 and the processing chamber S2. In sum, the precoating gas supply system may supply the precoating gas into at least one of the plasma generation chamber S1 and the processing chamber S2. In this case, the high frequency power supply 72 generates plasma of the precoating gas supplied into the plasma generation chamber S1 by the precoating gas supply system and introduced into the processing chamber S2 through the plurality of holes 40*h* of the partition plate 40, or plasma of the precoating gas supplied into the processing chamber S2 by the precoating gas supply system.

In the above-described exemplary embodiment, descriptions have been made on the example where the high frequency power supply 72 generates plasma of the precoating gas in the processing chamber S2 by supplying a high frequency power to the electrode 70 provided in the processing chamber S2. However, the present disclosure is not limited thereto. For example, the high frequency power supply 72 may supply a high frequency power to the placing table 13.

Figure 4:
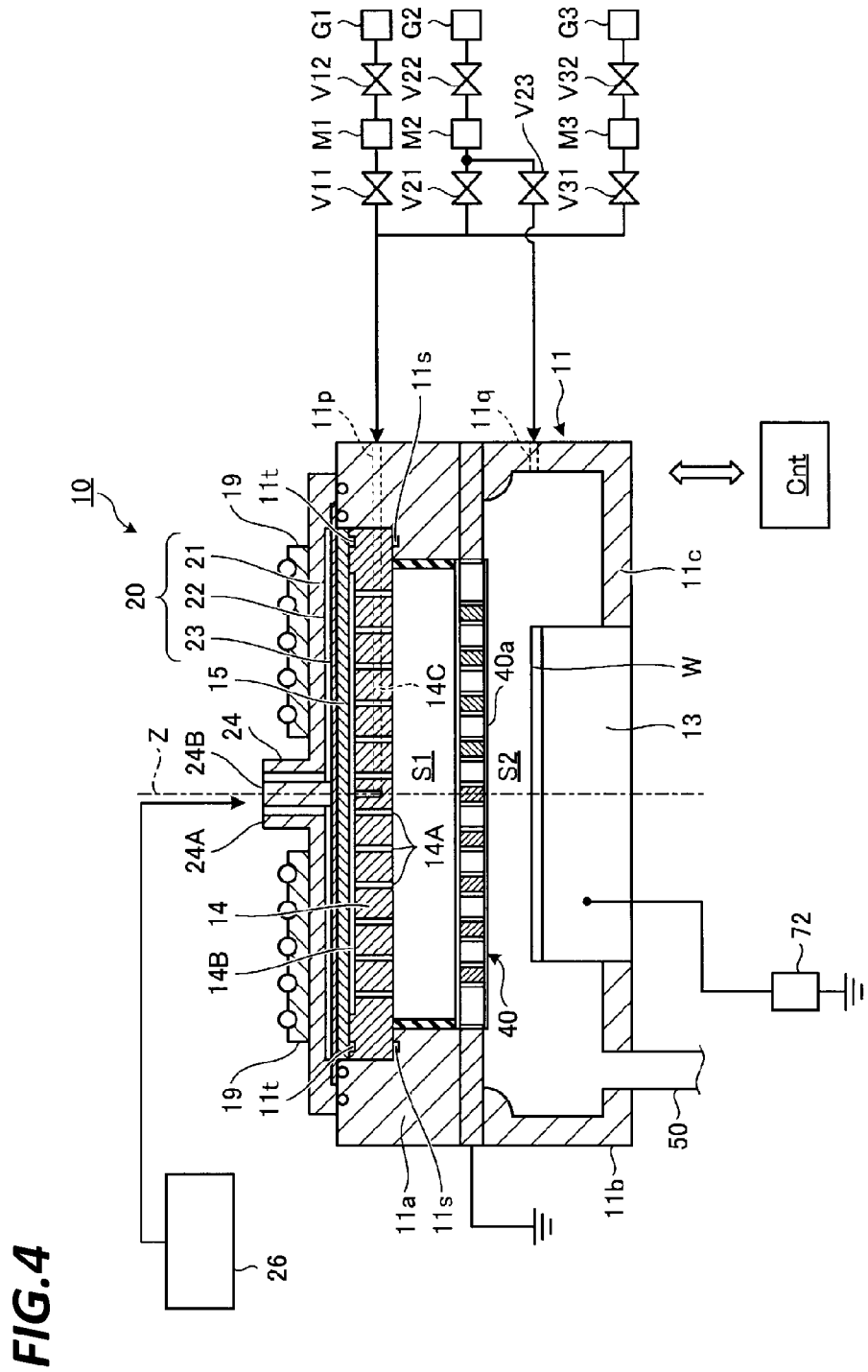
FIG. 4 is a view schematically illustrating Modification 1 of the plasma processing apparatus according to the exemplary embodiment.

FIG. 4 is a view schematically illustrating Modification 1 of the plasma processing apparatus according to an exemplary embodiment. A plasma processing apparatus 10 according to Modification 1 basically has the similar configuration to that of the plasma processing apparatus 10 illustrated in FIG. 1, and is different from the plasma processing apparatus 10 illustrated in FIG. 1 in view of a supply destination of the high frequency power supplied from the high frequency power supply 72. Accordingly, descriptions of the similar configuration to that of the plasma processing apparatus 10 illustrated in FIG. 1 will be omitted.

As illustrated in FIG. 4, in the plasma processing apparatus 10 of Modification 1, the high frequency power supply 72 is electrically connected to the placing table 13. In addition, in this case, the plasma processing apparatus 10 of Modification 1 does not have the electrode 70. The high frequency power supply 72 supplies a predetermined high frequency power to the placing table 13 so as to supply electromagnetic wave energy to the precoating gas supplied into the processing chamber S2 from the precoating gas supply system and introduced into the processing chamber S2 through the plurality of holes 40*h* of the partition plate 40. Accordingly, the high frequency power supply 72 generates plasma of the precoating gas in the processing chamber S2.

In the above-described exemplary embodiment, descriptions have been made on the example where plasma is generated in the plasma generation chamber S1 by causing the antenna 20 as a radial line slot antenna to emit microwaves. However, the present disclosure is not limited thereto. For example, as a method of generating plasma in the plasma generation chamber S1, a method using inductively coupled plasma (ICP) may be taken into account.

Figure 5:
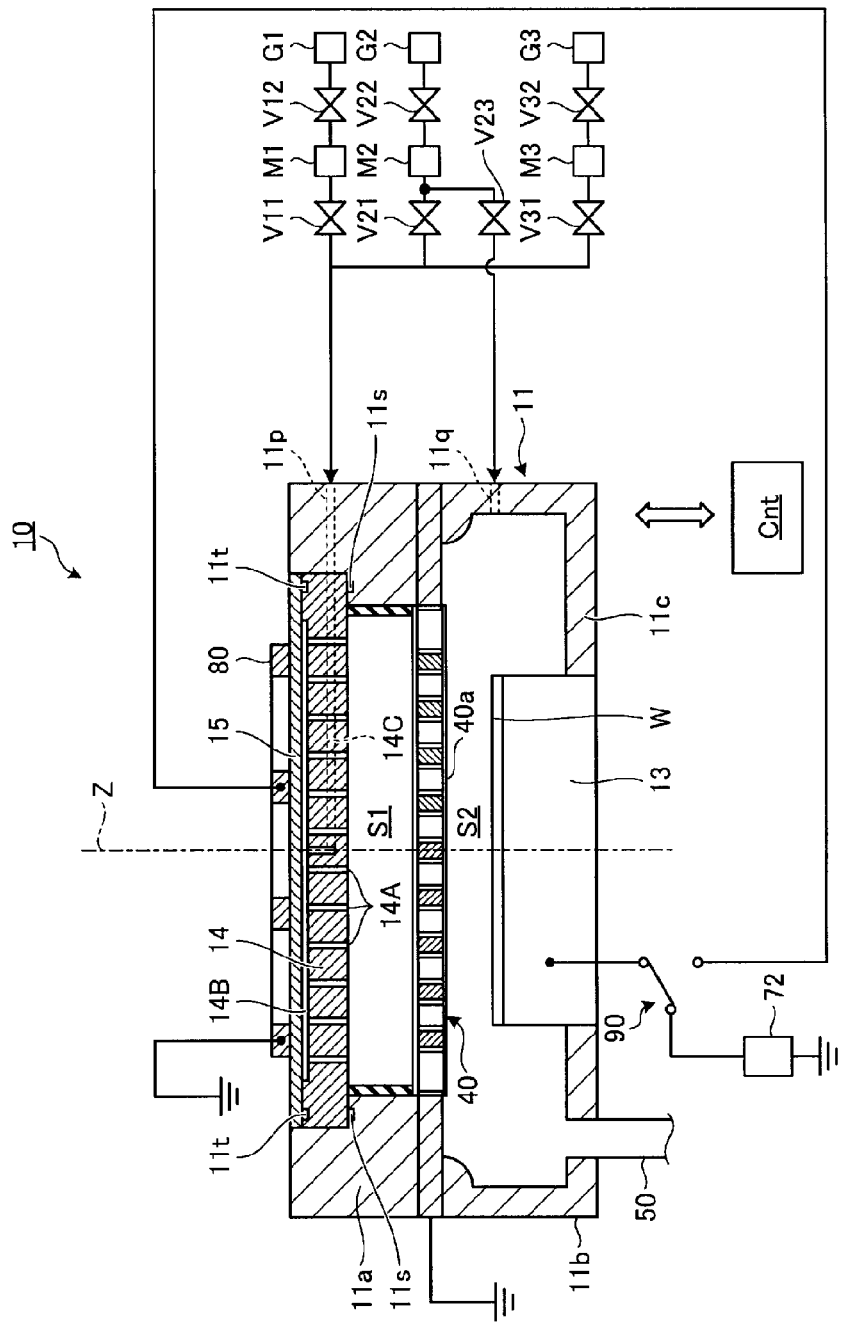
FIG. 5 is a view schematically illustrating Modification 2 of the plasma processing apparatus according to the exemplary embodiment.

FIG. 5 is a view schematically illustrating Modification 2 of the plasma processing apparatus according to an exemplary embodiment. A plasma processing apparatus 10 according to Modification 2 basically has the similar configuration to that of the plasma processing apparatus 10 illustrated in FIG. 1, and is different from the plasma processing apparatus 10 illustrated in FIG. 1 in that Modification 1 uses the ICP. Accordingly, descriptions of the similar configuration to that of the plasma processing apparatus 10 illustrated in FIG. 1 will be omitted.

As illustrated in FIG. 5, the plasma processing apparatus 10 of Modification 2 includes a coil antenna 80 arranged in a spiral shape, instead of the antenna 20. The plasma processing apparatus 10 of Modification 2 further includes a switch 90. In the plasma processing apparatus 10 of Modification 2, the high frequency power supply 72 is electrically connected to the placing table 13 via the switch 90. In this case, the plasma processing apparatus 10 of Modification 2 does not have the electrode 70.

When a high frequency power is supplied from the switch 90 to be described later, the coil antenna 80 forms an induction field in the plasma generation chamber S1 so as to generate plasma of a film formation gas or plasma of a rare gas in the plasma generation chamber S1. The antenna 80 is an example of the first plasma source.

The high frequency power supply 72 supplies a predetermined high frequency power to the placing table 13 through the switch 90 so as to supply electromagnetic wave energy to the precoating gas supplied from the precoating gas supply system into the plasma generation chamber S1 and introduced into the processing chamber S2 through the plurality of holes 40*h* of the partition plate 40. As a result, the high frequency power supply 72 generates plasma of the precoating gas in the processing chamber S2. The high frequency power supply 72 is an example of the second plasma source.

The switch 90 selectively supplies the high frequency power from the high frequency power supply 72 to either one of the placing table 13 and the coil antenna 80. The selection of the supply destination of the high frequency power by the switch 90 is controlled by the controller Cnt.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a processing container;
   a partition plate that has a plurality of holes each having a maximum width that is two times or less a sheath length corresponding to plasma of a plasma excitation gas, and partitions an inside of the processing container into a plasma generation chamber and a processing chamber;

a first gas supply configured to supply the plasma excitation gas to the plasma generation chamber;

a second gas supply configured to supply a precoating gas to the plasma generation chamber and the processing chamber;

a first plasma source that generates plasma of the plasma excitation gas supplied into the plasma generation chamber by the first gas supply;

a second plasma source that generates plasma of the precoating gas supplied into the plasma generation chamber by the second gas supply and introduced into the processing chamber through the plurality of holes of the partition plate; and a controller that causes the second plasma source to generate the plasma of the precoating gas in the processing chamber using the second plasma source before a plasma processing using the plasma of the plasma excitation gas is performed such that a precoating is performed on a surface of a partition plate on a side of the processing chamber.

2. The plasma processing apparatus of claim 1, wherein the first plasma source generates the plasma of the plasma excitation gas in the plasma generation chamber by emitting microwaves into the plasma generation chamber, and the second plasma source generates the plasma of the precoating gas in the processing chamber by supplying a high frequency power to an electrode provided in the processing chamber or a placing table inside the processing container.

3. A plasma processing apparatus comprising:

a processing container;

a partition plate that has a plurality of holes each having a maximum width that is two times or less a sheath length corresponding to plasma of a plasma excitation gas, and partitions an inside of the processing container into a plasma generation chamber and a processing chamber;

a first gas supply configured to supply the plasma excitation gas to the plasma generation chamber;

a second gas supply configured to supply a precoating gas to at least one of the plasma generation chamber and the processing chamber;

a first plasma source that generates plasma of the plasma excitation gas supplied into the plasma generation chamber by the first gas supply;

a second plasma source that generates plasma of the precoating gas supplied into the plasma generation chamber by the second gas supply and introduced into the processing chamber through the plurality of holes of the partition plate, or plasma of the precoating gas supplied into the processing chamber by the second gas supply; and a controller that causes the second plasma source to generate the plasma of the precoating gas in the processing chamber using the second plasma source before a plasma processing using the plasma of the plasma excitation gas is performed such that a precoating is performed on a surface of a partition plate on a side of the processing chamber, wherein the first plasma source generates the plasma of the plasma excitation gas in the plasma generation chamber by forming an induction field in the plasma generation chamber when a high frequency power is supplied, the second plasma source generates the plasma of the precoating gas in the processing chamber by supplying a high frequency power to an electrode provided in the processing chamber or a placing table inside the processing container, and the plasma processing apparatus further comprises a switch that selectively supplies the high frequency power from the second plasma source to the first plasma source and any one of the electrode provided in the processing chamber and the placing table inside the processing chamber.

4. The plasma processing apparatus of claim 1, further comprising a third gas supply configured to supply a processing gas to the plasma generation chamber or the processing chamber.

5. The plasma processing apparatus of claim 2, further comprising a third gas supply configured to supply a processing gas to the plasma generation chamber or the processing chamber.

6. The plasma processing apparatus of claim 3, further comprising a third gas supply configured to supply a processing gas to the plasma generation chamber or the processing chamber.

* * * * *